United States Patent
Booth

(10) Patent No.: US 8,698,533 B2
(45) Date of Patent: *Apr. 15, 2014

(54) PHASE MIXER WITH ADJUSTABLE LOAD-TO-DRIVE RATIO

(75) Inventor: Eric Booth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/397,511

(22) Filed: Feb. 15, 2012

(65) Prior Publication Data

US 2012/0146702 A1 Jun. 14, 2012

Related U.S. Application Data

(63) Continuation of application No. 13/029,986, filed on Feb. 17, 2011, now Pat. No. 8,125,260, which is a continuation of application No. 12/483,749, filed on Jun. 12, 2009, now Pat. No. 7,902,896.

(51) Int. Cl.
*H03K 5/13* (2006.01)

(52) U.S. Cl.
USPC .................. 327/231; 327/234; 327/236

(58) Field of Classification Search
USPC .......... 327/231, 234–236, 355, 361, 407–408
See application file for complete search history.

(56) References Cited

U.S. PATENT DOCUMENTS

| | | | |
|---|---|---|---|
| 6,133,773 A * | 10/2000 | Garlepp et al. | 327/247 |
| 6,982,579 B2 | 1/2006 | Lee | |
| 7,057,431 B2 | 6/2006 | Kwak | |
| 7,138,849 B2 | 11/2006 | Park | |
| 7,282,977 B2 | 10/2007 | Lee | |
| 7,417,478 B2 | 8/2008 | Kim et al. | |
| 7,902,896 B2 | 3/2011 | Booth | |
| 2011/0140759 A1 | 6/2011 | Booth | |

* cited by examiner

*Primary Examiner* — An Luu
(74) *Attorney, Agent, or Firm* — Dorsey & Whitney LLP

(57) ABSTRACT

Phase mixers, clock signal generators, memories and methods for providing an output signal having a phase relative to the phase difference of input clock signals are disclosed. One such phase mixer includes a phase mixer circuit having inputs and an output. The phase mixer is configured to receive a plurality of input clock signals and generate an output clock signal at the output having a phase relative to the plurality of input clock signals. The phase mixer further includes an adjustment circuit coupled to the phase mixer circuit. In some phase mixers, a control circuit coupled to the phase mixer circuit and the adjustment circuit is included. The control circuit is configured to generate a control signal based on the input signals to adjust an electrical load-to-drive ratio of the phase mixer.

23 Claims, 5 Drawing Sheets

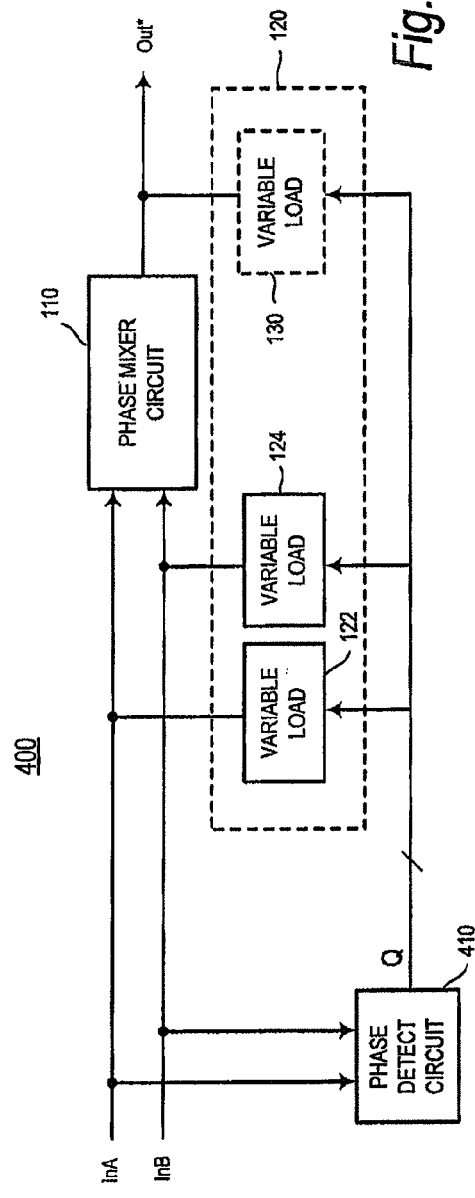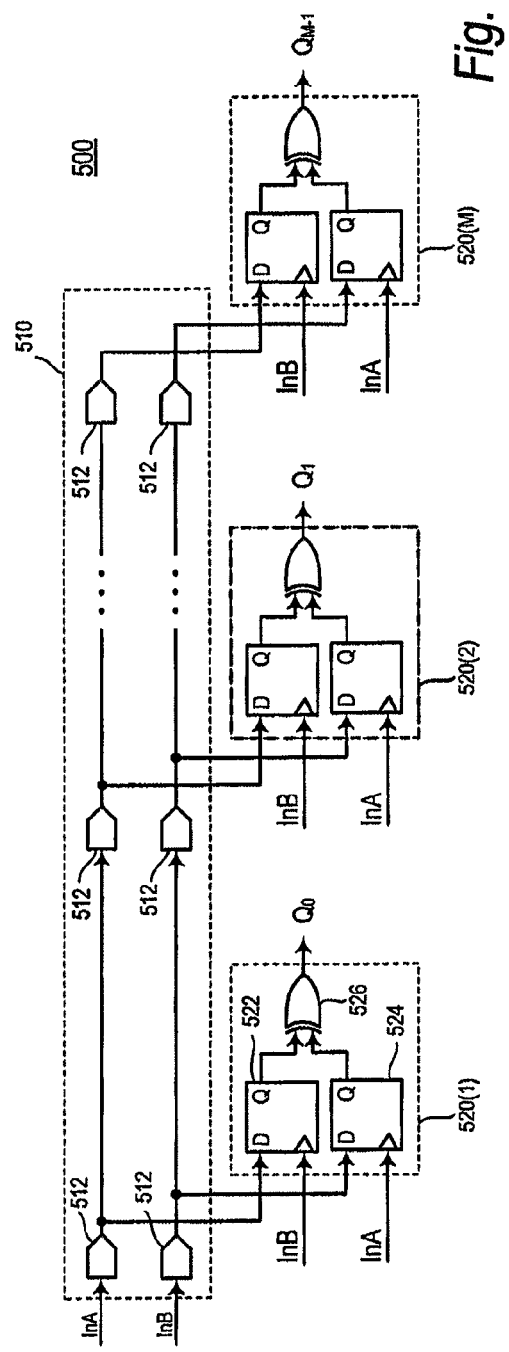

PHASE MIXER WITH ADJUSTABLE LOAD-TO-DRIVE RATIO

CROSS REFERENCE TO RELATED APPLICATION(S)

This application is a continuation of U.S. patent application Ser. No. 13/029,986, filed Feb. 17, 2011, U.S. Pat. No. 8,125,260, which is a continuation of U.S. patent application Ser. No. 12/483,749, filed Jun. 12, 2009, U.S. Pat. No. 7,902,896, which applications are incorporated herein by reference, in their entirety, for any purpose.

TECHNICAL FIELD

The invention relates generally to integrated circuits, and more particularly, in one or more of the embodiments, to circuits for adjusting phase relationships of signals, for example, in the generation of clock signals.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically are synchronized to external operations.

Internal clock signals that are synchronized with the external clock signal are generated in order to execute internal operations in synchronicity with the external operations. To synchronize external and internal clock signals in modern synchronous memory devices include clock signal generators that generate internal clock signals in response to external clock signals. A number of different approaches have been considered and utilized to implement clock signal generators, including delay-locked loops (DLLs), phased-locked loops (PLLs), and synchronous mirror delays (SMDs), as will be appreciated by those skilled in the art.

A DLL is a feedback circuit that operates to feed back a phase difference-related signal to control an adjustable delay line, until the timing of a first clock signal, for example, the system clock, is advanced or delayed such that its rising edge is coincident (or "locked") with the rising edge of a second clock signal, for example, the memory internal clock. The adjustable delay line typically includes a coarse adjustable portion and a fine adjustable portion. The fine adjustable portion provides higher adjustment resolution to synchronize the clock signals. Typically, the fine adjustable portion is implemented as a series of fine delay stages that can be activated or deactivated as necessary to provide the required fine delay for synchronization. Another example of a fine adjustable portion is provided by a phase mixer, for example, as described in U.S. Pat. No. 7,417,478 to Kim et al.

Phase mixers are used for their ability to do very high resolution digital-to-time conversion. For example, for a two-signal input phase mixer, an output signal is generated from two input signals that are out of phase. The resulting output signal has a phase relative to the phase difference of the two input signals. A weakness of a phase mixer, however, is that non-linearity of the phase mixer response increases with phase difference of the input signals. That is, the greater the phase difference of the input signals, the greater the non-linear response of the phase mixer. As a result, controlling a phase mixer over a broad range of phase differences increases complexity of control circuitry and its operation to accommodate the increasing non-linear response.

BRIEF DESCRIPTION OF THE DRAWINGS

FIG. 4 is a block diagram of a phase mixer according to an embodiment of the invention.

FIG. 5 is a block diagram of a phase detect circuit according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
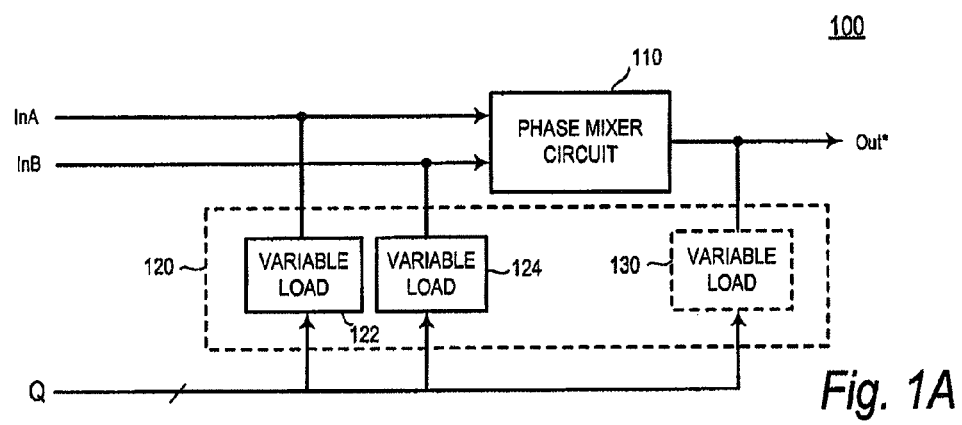
FIG. 1A is a block diagram of a phase mixer according to an embodiment of the invention.

FIG. 1A illustrates a phase mixer 100 according to an embodiment of the invention. In one embodiment, the phase mixer 100 is included in a clock signal generator to provide an adjustable delay, for example, a fine adjustable delay. The phase mixer 100 includes a phase mixer circuit 110 configured to receive input clock signals InA and InB and generate an output clock signal Out in response. The phase mixer circuit 110 generates the Out signal having a phase relative to the InA and InB signals. In some embodiments, the phase mixer circuit 110 generates the Out signals having a phase relative to the InA, InB signals in accordance with a control signal. In other embodiments, the phase mixer circuit may generate a plurality of Out signals having different phases relative to the InA, InB signals. The phase mixer 100 further includes an adjustment circuit such as a variable load circuit 120 coupled to the input of the phase mixer circuit 110. The variable load circuit 120 is configured to adjust the load-to-drive ratio of the input of the phase mixer. In the embodiment of FIG. 1A, the variable load circuit 120 includes load stages 122 and 124 coupled to a respective input of the phase mixer circuit 110. A control signal Q is provided to the load stages 122 and 124 to adjust the load stage, and consequently, adjust the load-to-drive ratio of the input. The variable load circuit 120 may also include load stage 130 coupled to the output of the phase mixer circuit 110. The load stage 130 may be controlled by the Q signal as well. In some embodiments, the load stages of the variable load circuit 120 adjusts the load aspect of the ratio in accordance with the Q signal. For example, the load stages may adjust an electrical loading on the respective signal line according to the Q signal.

In operation, InA and InB signals are provided to the phase mixer circuit 110. The phase mixer circuit 110 generates the Out signal having a phase relative to the InA, InB signals. The loading of the load stages 122, 124, 130 are adjusted according to the Q signal to change the load-to-drive ratio on the respective signal line. Changing the load-to-drive ratio on the signal lines alters the response of the phase mixer 100. For example, the linearity of the phase mixer 100 can be modified by increasing a load-to-drive ratio at the input and/or the output. The response of the phase mixer 100 can be adjusted according to the characteristics of the InA, InB signals, for example, the phase difference between the InA, InB signals. The frequency of the InA, InB signals may alternatively or additionally be the basis for adjusting the response of the phase mixer 100. In some embodiments of the invention, the response of the phase mixer 100 is dynamically adjusted during its operation.

Figure 1B:
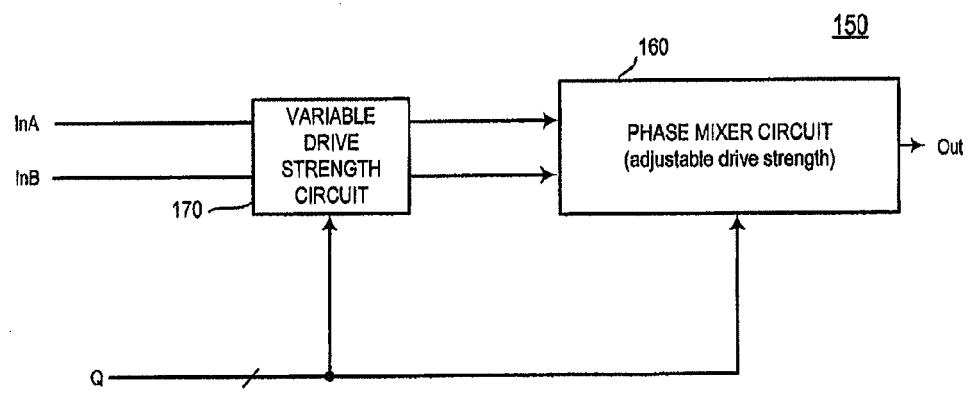
FIG. 1B is a block diagram of a phase mixer according to another embodiment of the invention.

FIG. 1B illustrates a phase mixer 150 according to an embodiment of the invention. In an embodiment, the phase mixer 150 is included in a clock signal generator to provide an adjustable delay, for example, a fine adjustable delay. The phase mixer 150 includes a phase mixer circuit 160 configured to receive input clock signals InA and InB and generate an output clock signal Out in response. The phase mixer circuit 160 generates the Out signal having a phase relative to the InA and InB signals. In some embodiments, the phase mixer circuit 160 generates the Out signals having a phase relative to the InA, InB signals in accordance with a control signal. In other embodiments, the phase mixer circuit may generate a plurality of Out signals having different phases relative to the InA, InB signals. The phase mixer 150 further includes a variable drive strength circuit 170 coupled to the input of the phase mixer circuit 160. The variable drive strength circuit 170 is configured to adjust the load-to-drive ratio of the input of the phase mixer by varying the drive strength of signal drivers (not shown) included in the variable drive strength circuit 170. A control signal Q is provided to the variable drive strength circuit 170 to adjust the drive strength, and consequently, adjust the load-to-drive ratio of the input. In some embodiments of the invention, the phase mixer circuit 160 includes output drivers (not shown) having drive strengths that are adjustable according to the Q signal to provide adjustment of an output load-to-drive ratio. The variable drive strength circuit 170 and the output drivers of the phase mixer circuit 160 having adjustable drive strengths adjust the drive aspect of the ratio in accordance with the Q signal. For example, the drive strength circuits may adjust an drive strength of a buffer circuit coupled the respective signal line (e.g., InA, InB, and/or Out signals lines) according to the Q signal.

Figure 2:
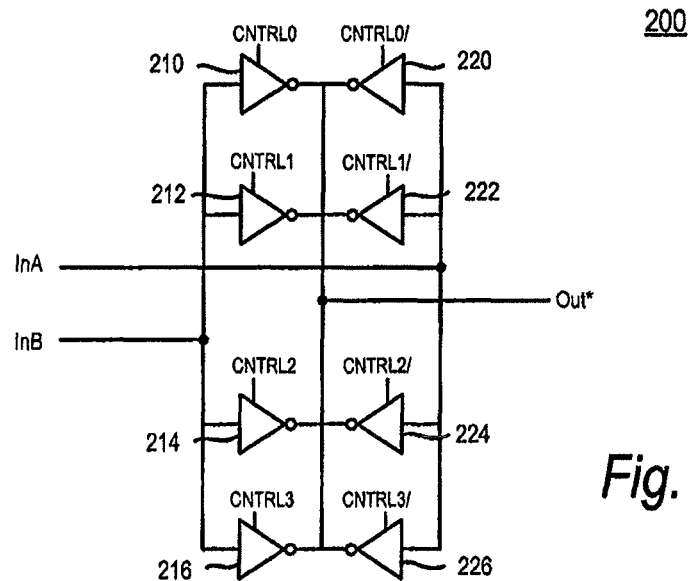
FIG. 2 is a block diagram of a phase mixer circuit according to an embodiment of the invention.

FIG. 2 illustrates a phase mixer circuit 200. In some embodiments of the invention, the phase mixer circuit 200 is used as the phase mixer circuits 110, 160 (FIGS. 1A, 1B). The phase mixer circuit 200 is a single stage phase mixer circuit that generates an output clock signal Out having a phase relationship relative to input clock signals InA, InB according to a control signal CNTRL. The phase mixer circuit 200 includes inverters 210-216 configured to receive the InB signal and further having inverters 220-226 configured to receive the InA signal. The outputs of the inverters 210-226 provide the resulting Out signal. The inverters 210-216 are activated according to CNTRL signal. In the embodiment of the phase mixer circuit 200, the CNTRL signal represents four binary digits ("bits") CNTRL0-CNTRL3 that are provided to the inverters 210-216. Complementary control signals CNTRL0/-CNTRL3/ are provided to inverters 220-226.

The InA, InB signals are combined to provide the Out signal. The contribution of the InA, InB signals to the Out signal is based on the activation of the inverters 210-226 as controlled by the CNTRL signal. Generation of the CNTRL signals is known in the art, and in the interest of brevity, is not discussed in detail herein. Those ordinarily skilled in the art, however, will be able to practice the present invention. For the embodiment of FIG. 2, the contribution of the InA, InB signals are as follows:

| CNTRL<3:0> | Out |
|---|---|
| 0000 | $InA_{100\%}$ |
| 0001 | $InA_{75\%}$ |
| 0011 | $InA_{50\%}, InB_{50\%}$ |
| 0111 | $InB_{75\%}$ |
| 1111 | $InB_{100\%}$ |

In other embodiments, the phase mixer circuit 200 is modified to provide greater or lower resolution. That is, the phase mixer circuit 200 can be modified to have greater or fewer inverters to change the selection of ratios for InA, InB contribution to the Out signal.

Figure 3:
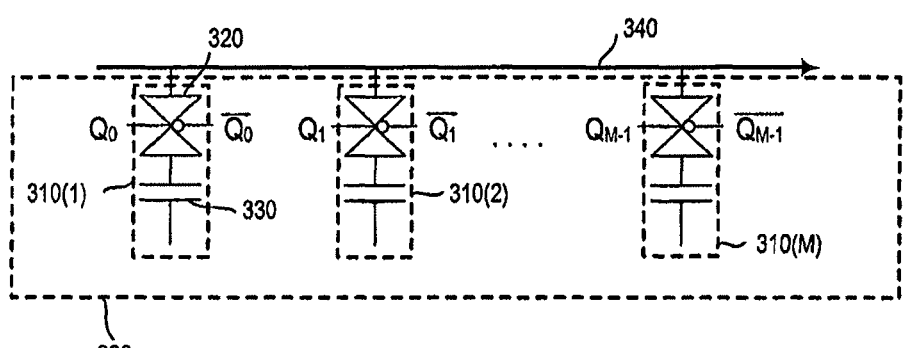
FIG. 3 is a block diagram of a variable load circuit according to an embodiment of the invention.

FIG. 3 illustrates a variable load circuit 300 according to an embodiment of the invention. In some embodiments, the load circuit 300 is used as the load stage 122, 124, 130 (FIG. 1A). The load circuit 300 includes load elements 310(1)-310(M), where M represents a whole number. A load element 310 includes a transfer gate 320 and a capacitance 330. In some embodiments, the capacitance 330 may be implemented using a discrete capacitor; in some embodiments, the capacitance 330 may be implemented by parasitic capacitance. Each of the load elements 310(1)-310(M) is selectively coupled to a signal line 340 in accordance with control signal Q. The signal line 340, for example, may represent the InA, InB or Out signal line of the phase mixer 100. In the embodiment illustrated in FIG. 3, the Q signal represents M-bits. In operation, when a respective transfer gate 320 of a load element 310 is activated, the corresponding capacitance 330 is coupled to the signal line 340 thereby increasing the load on the signal line 340. The load on the signal line 340 can be increased by coupling more capacitance 330 and decreased by decoupling capacitance 330.

FIG. 4 illustrates a phase mixer 400 according to an embodiment of the invention. The phase mixer 400 includes a phase mixer circuit 110 and variable load circuit 120, as in the phase mixer 100 (FIG. 1A). Operation of the phase mixer circuit 110 and the variable load circuit 120 is as previously described. The phase mixer 400 further includes a phase detect circuit 410 configured to receive the InA, InB signals and generate a Q signal for adjusting the variable load circuit 120. The phase detect circuit 410 generates the Q signal based on the phase difference between the InA, InB signals to adjust the response of the phase mixer 400. In one embodiment, the response of the phase mixer 400 is adjusted to improve its linearity by increasing the load-to-drive ratio at the input and/or the output with increasing phase difference. In this manner the linearity of digital to time conversion may be optimized for a wide phase range of phase mixer inputs.

In another embodiment, phase mixer 150 (FIG. 1B) includes a phase detect circuit (e.g., phase detect circuit 410) that generates a Q signal based on a phase difference between the InA, InB signals for adjusting the variable drive strength circuit 170 in order to adjust an input load-to-drive ratio, and also variable drive strength circuit 180 if included, to adjust an output load-to-drive ratio. In an embodiment having a phase mixer 160 with an output buffer having adjustable drive strength, the Q signal can be further provided to the phase mixer 160 to adjust the drive strength of a phase mixer output driver, and consequently, adjust an output load-to-driver ratio.

FIG. 5 illustrates a phase detect circuit 500 according to an embodiment of the invention. In some embodiments, the phase detect circuit 500 may be used as the phase detect circuit 410 of the phase mixer 400 (FIG. 4). In some embodiments, the phase detect circuit 500 may be used as a phase detect circuit with the phase mixer 150 (FIG. 1B) to provide a Q signal for adjusting a drive strength of the adjustable drive strength circuits. The phase detect circuit 500 includes a delay line 510 having a plurality of delay stages 512 and a plurality of phase detect stages 520(1)-520(M), where M is a whole number. The phase detect stages 520 are coupled to the output of respective delay stages 512. Each delay stage 520 includes a pair of flip-flops 522, 524 coupled to the output of a respective delay stage 512 and further includes an exclusive-OR logic gate 526 coupled to the output of the flip-flops. Each of the phase detect stages 520 is further configured to receive the InA, InB signals. The phase detect stages 520 generate a respective bit of the Q signal that can be used to adjust the variable load circuit 120.

In operation, the InA, InB signals propagate through the delay line 510. Each of the phase detect stages 520 generates a respective bit of the Q signal indicative of the phase difference between the InA, InB signals. A phase detect stage 520 generates an active output signal when the InA, InB signals have a non-zero phase difference and the delayed InA, InB signal output by the respective delay stage 512 "leads" the InA, InB signal, respectively. For example,

| Phase spacing of InA and InB (d) | Q value |
|---|---|
| d > M unit delays | 1 ... 11 |
| ... | ... |
| 2 unit delays < d < 3 unit delays | 0 ... 11 |
| 1 unit delay < d < 2 unit delays | 0 ... 01 |
| d < 1 unit delay | 0 ... 00 |

As a result, the InA, InB phase difference is measured relative to the delay stages 520. That is, the resulting Q signal indicates the InA, InB phase difference in terms of a number of delay stages. As previously discussed, the Q signal may be used to adjust the load of the variable load 120 (FIG. 4) to adjust the response of the phase mixer 400.

Figure 6:
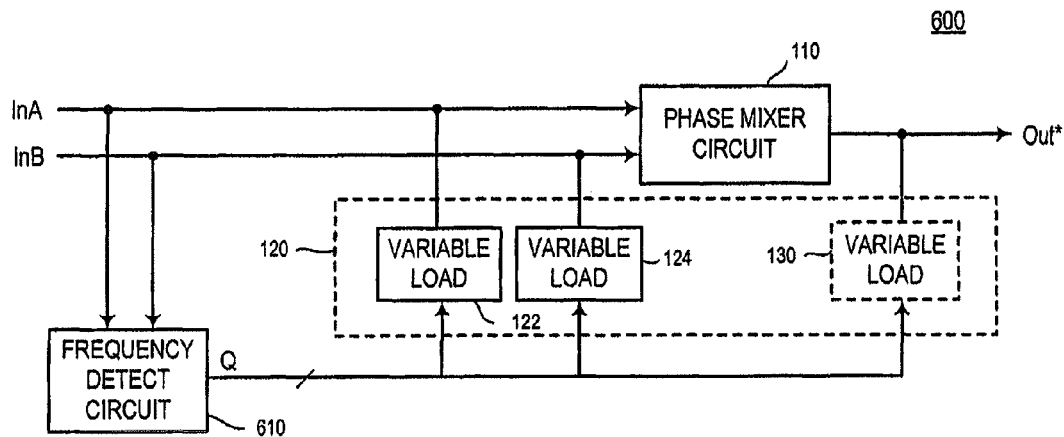
FIG. 6 is a block diagram of a phase mixer according to an embodiment of the invention.

FIG. 6 illustrates a phase mixer 600 according to an embodiment of the invention. The phase mixer 600 includes a phase mixer circuit 110 and a variable load circuit 120 as in the phase mixer 100 (FIG. 1A). Operation of the phase mixer circuit 110 and the variable load circuit 120 is as previously described. The phase mixer 600 further includes a frequency detect circuit 610 configured to receive the InA, InB signals and generate a Q signal for adjusting the variable load circuit 120. The phase detect circuit 610 generates the Q signal based on the frequency of the InA, InB signals to adjust the variable load circuit 120 to change the load-to-drive ratio. For example, in some embodiments, the load-to-drive ratio is adjusted inversely with the frequency of the InA, InB signals. As a result, maximum linearity for the phase mixer 600 can be realized for a frequency. A phase mixer that adjusts the load-to-drive ratio based on InA, InB frequency may be advantageous where maximum frequency is more desirable than linearity. For example, adjusting input and/or the output load-to-drive ratio based on InA, InB phase difference where the phase difference is large, the load may be great enough to negatively affect the maximum frequency of the clock signal transmitted through the phase mixer. Adjusting the response of a phase mixer based on input clock frequency rather than phase difference (at least where the phase difference is large) may avoid some of the negative effects.

Figure 7:
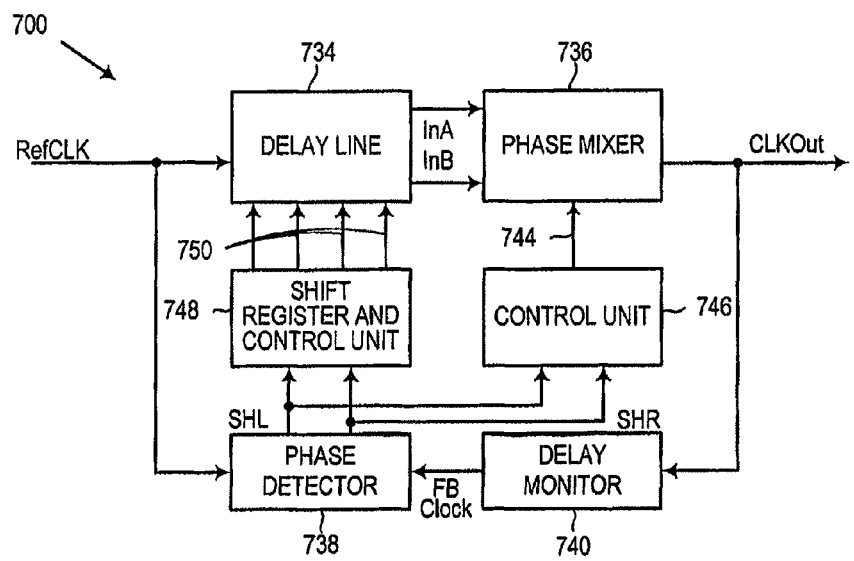
FIG. 7 is a block diagram of a clock generator according to an embodiment of the invention.

FIG. 7 illustrates a clock generator 700 according to an embodiment of the present invention. The clock generator 700 is implemented as a delay-locked loop (DLL). The clock generator 700 generates an output clock signal CLKOut having a phase relationship to an input clock signal RefCLK so that operation of a circuit clocked by the CLKOut signal will operate in synchronicity with the RefCLK signal. The clock generator 700 includes a delay line 734 having an adjustable coarse delay and a phase mixer 736 according to an embodiment of the invention. The clock generator 700 further includes a phase detector 738 and a delay model 740. The delay model 740 models an internal propagation delay and delays the CLKOut signal to provide a feedback (FB) clock signal. The phase detector 738 detects a phase difference between the FB clock signal and the RefCLK signal and generates control signals SHL and SHR indicative of the relative phase difference. Shift register 748 and control circuit 746 are coupled to the phase detector 738 and generate delay control signals 750 and phase mixer control signals 744 (e.g., CNTRL signals) to adjust the delay of the delay line 734 and the phase mixer 736, respectively. The phase mixer 736 is coupled to the delay line 734 to receive InA and InB signals. In some embodiments of the invention, the InA, InB signals may be provided by input and output clock signals of a delay stage (not shown) of the delay line 734. As previously discussed, the phase mixer 736 generates an Out signal having a phase relative to the InA, InB signals in accordance with the phase mixer control signals, which are generated by the control unit 746 based on the SHL, SHR signals. An overall delay between the RefCLK and CLKOut signals can be fine tuned by the phase mixer 736.

Figure 8:
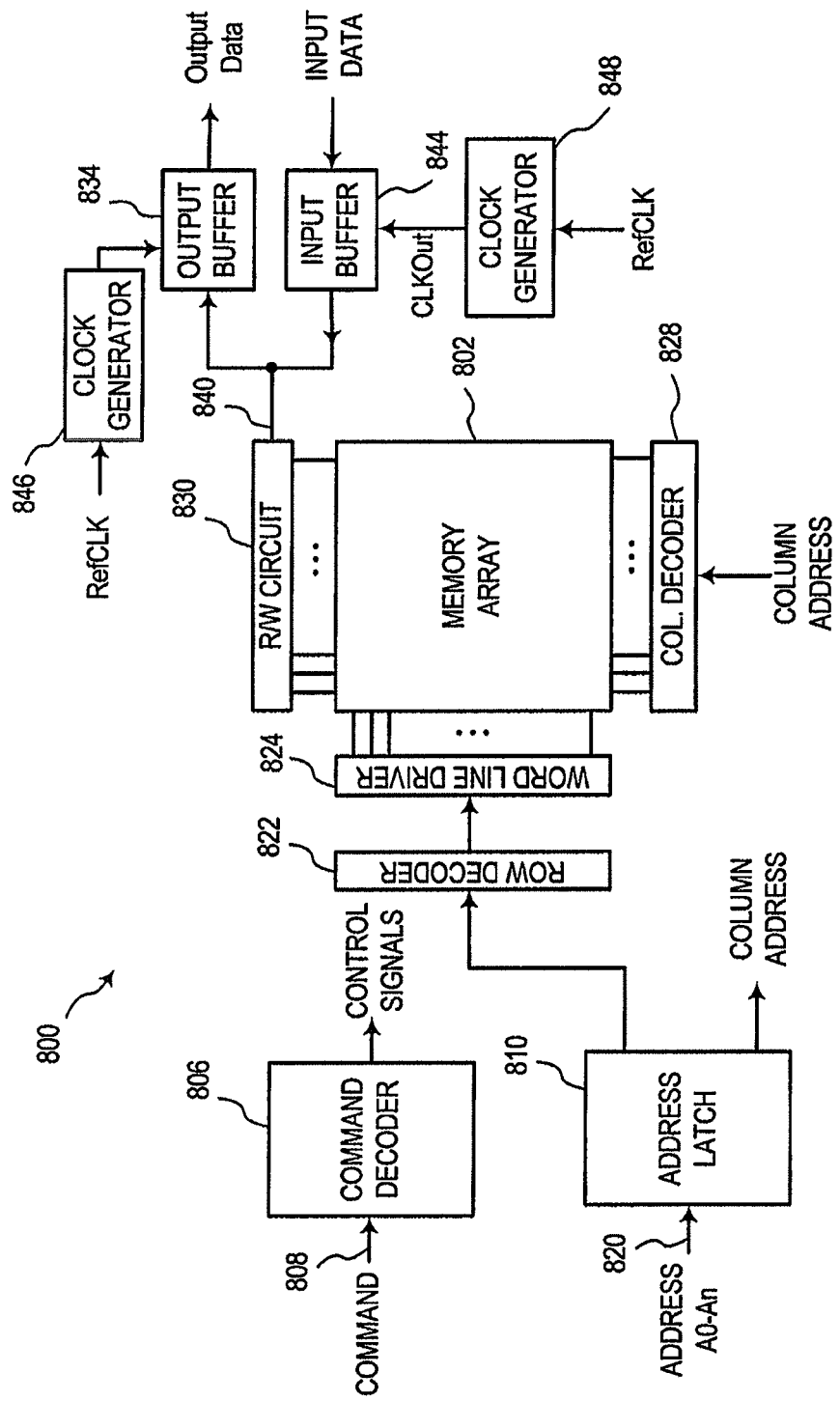
FIG. 8 is a block diagram of a memory including a phase mixer according to an embodiment of the invention.

FIG. 8 illustrates a portion of a memory 800 according to an embodiment of the invention. The memory 800 includes phase mixer according to an embodiment of the invention, for example, in clock generators 846, 848. The memory 800 includes an array 802 of memory cells, which may be, for example, DRAM memory cells, SRAM memory cells, flash memory cells, or some other types of memory cells. The memory 800 includes a command decoder 806 that receives memory commands through a command bus 808 and generates corresponding control signals within the memory 800 to carry out various memory operations. Row and column address signals are applied to the memory 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line corresponding to a received column address are coupled to a read/write circuitry 830 to provide read data to a data output buffer 834 via an input-output data bus 840. Write data are applied to the memory array 802 through a data input buffer 844 and the memory array read/write circuitry 830.

A clock generator 846 having a phase mixer according to an embodiment of the invention is coupled to the data output buffer 834 and receives a reference clock signal RefCLK. The clock generator 846 provides clock signals that are used to clock the data output buffer 848 to latch read data that is to be output from the memory 800. A clock generator 848 having a phase mixer according to an embodiment of the invention is coupled to the data input buffer 844 and receives a reference clock signal RefCLK. The clock generator 848 provides clock signals that are used to clock the data input buffer 844 to latch write data that is to be written to the array 802. The command decoder 806 responds to memory commands applied to the command bus 808 to perform various operations on the memory array 802. In particular, the command decoder 806 is used to generate internal control signals to read data from and write data to the memory array 802.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A phase mixer, comprising:
a phase mixer circuit configured to receive a plurality of input signals and generate an output signal having a phase relative to the plurality of input signals; and
an adjustment circuit coupled to the phase mixer circuit and configured to adjust a load-to-drive ratio of the phase mixer based, at least in part, on a phase difference of the plurality of input signals, wherein the adjustment circuit comprises a load circuit coupled to an output of the phase mixer circuit and configured to electrically load the output based, at least in part, on a control signal, the control signal based, at least in part, on a phase difference between a first input signal of the plurality of input signals and a second input signal of the plurality of input signals.

2. The phase mixer of claim 1, wherein the load circuit is a first load circuit and the adjustment circuit further comprises:
a second load circuit coupled to an input of the phase mixer circuit and configured to electrically load the input.

3. The phase mixer of claim 1, wherein the phase mixer circuit comprises a plurality of inverters.

4. The phase mixer of claim 1, wherein the load circuit is configured to electrically load the output by providing a capacitance to the output.

5. A phase mixer, comprising:
a phase mixer circuit configured to receive a plurality of input signals and generate an output signal; and
a variable load-to-drive ratio circuit coupled to the output of the phase mixer circuit, the variable load-to-drive ratio circuit configured to adjust the electrical load-to-drive ratio of the output of the phase mixer in accordance with a control signal, wherein the variable load-to-drive ratio circuit comprises output drivers having adjustable drive strengths included in the phase mixer circuit and configured to adjust the electrical load-to-drive ratio of the output of the phase mixer circuit.

6. The phase mixer of claim 5, wherein the output drivers are configured to adjust the electrical load-to-drive ratio of the output of the phase mixer circuit based, at least in part, on a control signal indicative of a phase difference between two of the plurality of input signals.

7. The phase mixer of claim 6, further comprising:
a phase detect circuit coupled to the variable load-to-drive circuit and configured to receive the plurality of input signals, the phase detect circuit further configured to generate the control signal based, at least in part, on the plurality of input signals.

8. The phase mixer of claim 7, wherein the phase mixer comprises a plurality of delay stages, each delay stage configured to generate a respective bit of the control signal based, at least in part, on the phase difference between the input signals.

9. The phase mixer of claim 5, wherein the variable load-to-drive ratio circuit is configured to dynamically adjust the electrical load-to-drive ratio of the output of the phase mixer.

10. The phase mixer of claim 5, wherein each of the output drivers are configured to adjust the drive strength of a respective buffer circuit.

11. The phase mixer of claim 5, wherein the phase mixer circuit is a single-stage phase mixer.

12. A method of generating an output signal, comprising:
adjusting a load-to-drive ratio of a signal line based, at least in part, on a phase difference of first and second input signals by adjusting capacitance on an output from which the output signal is provided, wherein said adjusting includes generating a control signal based, at least in part, on frequencies of the first and second input signals and adjusting the capacitance based, at least in part, on the control signal.

13. The method of claim 12, wherein the capacitance comprises parasitic capacitance.

14. The method of claim 12, wherein said adjusting comprises:
selectively coupling a discrete capacitor to the output with a transfer gate.

15. The method of claim 12, wherein adjusting the load-to-drive ratio comprises:
dynamically adjusting the load-to-drive ratio.

16. The method of claim 12, further comprising:
detecting a phase difference between first and second input signals at a plurality of stages of a delay line;
generating a respective bit of a control signal at each of the plurality of stages based, at least in part, on the respective phase differences; and
adjusting the load-to-drive ratio based, at least in part, on the control signal.

17. The method of claim 12, wherein said adjusting a load-to-drive ratio of a signal line based on first and second input signals comprises:
adjusting a capacitance of an input to which the first input signal is provided.

18. A phase mixer, comprising:
a phase mixer circuit configured to receive a plurality of input signals and generate an output signal having a phase relative to the plurality of input signals;
an adjustment circuit coupled to the phase mixer circuit and configured to adjust a load-to-drive ratio of the phase mixer, wherein the adjustment circuit comprises a load circuit coupled to an output of the phase mixer circuit and configured to electrically load the output; and
wherein the load circuit is configured to electrically load the output based, at least in part, on a control signal and wherein the control signal is based, at least in part, on a phase difference between a first input signal of the plurality of input signals and a second input signal of the plurality of input signals.

19. A phase mixer, comprising:
a phase mixer circuit configured to receive a plurality of input signals and generate an output signal having a phase relative to the plurality of input signals;
an adjustment circuit coupled to the phase mixer circuit and configured to adjust a load-to-drive ratio of the phase mixer, wherein the adjustment circuit comprises a load circuit coupled to an output of the phase mixer circuit and configured to electrically load the output; and
wherein the phase mixer circuit comprises a plurality of inverters.

20. A method of generating an output signal, comprising:
adjusting a load-to-drive ratio of a signal line based on first and second input signals by adjusting capacitance on an output from which the output signal is provided; and
wherein the capacitance comprises parasitic capacitance.

21. A method of generating an output signal, comprising:
adjusting a load-to-drive ratio of a signal line based on first and second input signals by adjusting capacitance on an output from which the output signal is provided; and
wherein said adjusting comprises selectively coupling a discrete capacitor to the output with a transfer gate.

22. A method of generating an output signal, comprising:
adjusting a load-to-drive ratio of a signal line based on first and second input signals by adjusting capacitance on an output from which the output signal is provided; and
wherein said adjusting comprises:
generating a control signal based, at least in part, on the frequencies of the first and second input signals; and
adjusting the capacitance based, at least in part, on the control signal.

23. A method of generating an output signal, comprising:
detecting a phase difference between first and second input signals at a plurality of stages of a delay line;
generating a respective bit of a control signal at each of the plurality of stages based, at least in part, on the respective phase differences;
adjusting a load-to-drive ratio of a signal line based on first and second input signals by adjusting capacitance on an output from which the output signal is provided; and
adjusting the load-to-drive ratio based, at least in part, on the control signal.

* * * * *